| (12) | United States Patent | (10) Patent No.: | US 9,859,426 B1 |
|---|---|---|---|
| | Loubet et al. | (45) Date of Patent: | Jan. 2, 2018 |

(54) SEMICONDUCTOR DEVICE INCLUDING OPTIMIZED ELASTIC STRAIN BUFFER

(71) Applicant: International Business Machines Corporation, Armonk, NY (US)

(72) Inventors: Nicolas J. Loubet, Guilderland, NY (US); Yann A. Mignot, Slingerlands, NY (US); Pierre Morin, Grenoble (FR)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/196,467

(22) Filed: Jun. 29, 2016

(51) Int. Cl.
  *H01L 29/66* (2006.01)
  *H01L 29/78* (2006.01)
  *H01L 29/16* (2006.01)
  *H01L 29/165* (2006.01)

(52) U.S. Cl.
  CPC ........ *H01L 29/7849* (2013.01); *H01L 29/165* (2013.01); *H01L 29/1608* (2013.01); *H01L 29/6653* (2013.01); *H01L 29/6656* (2013.01); *H01L 29/66795* (2013.01); *H01L 29/785* (2013.01)

(58) Field of Classification Search
  CPC ......... H01L 29/7851; H01L 21/823821; H01L 29/7848; H01L 29/7849; H01L 29/785; H01L 29/1075
  See application file for complete search history.

(56) References Cited

U.S. PATENT DOCUMENTS

| 6,991,998 | B2 | 1/2006 | Bedell et al. |
|---|---|---|---|
| 7,115,945 | B2 | 10/2006 | Lee et al. |
| 7,198,995 | B2 | 4/2007 | Chidambarrao et al. |
| 7,303,999 | B1 | 12/2007 | Sriraman et al. |
| 7,799,592 | B2 | 9/2010 | Lochtefeld |
| 8,841,178 | B1 | 9/2014 | Basker et al. |
| 8,952,420 | B1 | 2/2015 | Loubet et al. |
| 9,087,903 | B2 | 7/2015 | Huang et al. |
| 9,099,559 | B2 | 8/2015 | Morin |
| 9,236,474 | B2 | 1/2016 | Morin |
| 9,530,710 | B2 * | 12/2016 | Chen ................... H01L 23/3171 |

* cited by examiner

*Primary Examiner* — Sonya D McCall Shepard
(74) *Attorney, Agent, or Firm* — Cantor Colburn LLP; Vazken Alexanian (57) ABSTRACT

According to yet another non-limiting embodiment, a fin-type field effect transistor (finFET) including a strained channel region includes a semiconductor substrate extending along a first axis to define a length, a second axis perpendicular to the first axis to width, and a third direction perpendicular to the first and second axes to define a height. At least one semiconductor fin on an upper surface of the semiconductor substrate includes a semiconductor substrate portion on an upper surface of the semiconductor substrate, a strain-inducing portion on an upper surface of the semiconductor substrate portion, and an active semiconductor portion defining a strained channel region on an upper surface of the strain-inducing portion. A first height of the semiconductor substrate portion is greater than a second height of the strain-inducing portion.

16 Claims, 10 Drawing Sheets

SEMICONDUCTOR DEVICE INCLUDING OPTIMIZED ELASTIC STRAIN BUFFER

BACKGROUND

The present invention relates to a semiconductor device, and more particularly, to three-dimensional strained semiconductor devices.

Three-dimensional semiconductor devices such as fin-type field effect transistors (finFETs) are widely used due to their ability to reduce leakage current and short-channel effects at a reduced device footprint. Additionally, the three-dimensional channel regions formed by the semiconductor fin of such devices allow the channel region to be accesses across an area that covers three surfaces. The raised fin, and thus the channel, also reduces electric field coupling between adjacent devices as compared to conventional planer transistors. During operation, holes (or electrons) travel from a source region to a drain region via the three-dimensional channel region form defined by the fin. Therefore, various fabrication methodologies and channel formation processes make it possible to control hole (or electron) mobility of the finFET.

SUMMARY

According to a non-limiting embodiment of the present invention, a method of straining a channel region of a fin-type field effect transistor (finFET) includes forming a first semiconductor layer in a strained state on an upper surface of a semiconductor substrate and forming a second semiconductor layer on an upper surface of the first semiconductor layer. The method further includes patterning the second semiconductor layer to form a semiconductor fin on an upper surface of the first semiconductor layer, the semiconductor fin defining a strained channel region of the finFET. The method further includes etching the first semiconductor layer to extend a depth of the semiconductor fin into the semiconductor layer and below the strain-inducing layer so as to relieve a strain in the first semiconductor layer and enhance the strain in the channel region.

According to another non-limiting embodiment, a method of straining in a channel region of a fin-type field effect transistor (finFET) includes forming a strain-inducing layer on an upper surface of a semiconductor substrate, the strain-inducing layer having a first lattice constant that is mismatched with respect to a second lattice constant of the semiconductor substrate. The method further includes forming an active semiconductor layer on an upper surface of the strain-inducing layer, the active semiconductor layer having a third lattice constant that is mismatched with respect the first lattice constant. The method further includes patterning the active semiconductor layer to form at least one semiconductor fin that defines a channel region of the finFET, and etching the strain-inducing layer to increase a depth of the at least one fin and relieve a first strain applied to the strain-inducing layer while inducing a second strain applied to the at least one semiconductor fin. The method further includes extending the depth of the at least one semiconductor fin into the semiconductor substrate and below the strain-inducing layer so as to increase the second strain applied to the channel region defined by the semiconductor fin.

According to yet another non-limiting embodiment, a fin-type field effect transistor (finFET) including a strained channel region includes a semiconductor substrate extending along a first axis to define a length, a second axis perpendicular to the first axis to width, and a third direction perpendicular to the first and second axes to define a height. At least one semiconductor fin on an upper surface of the semiconductor substrate includes a semiconductor substrate portion on an upper surface of the semiconductor substrate, a strain-inducing portion on an upper surface of the semiconductor substrate portion, and an active semiconductor portion defining a strained channel region on an upper surface of the strain-inducing portion. A first height of the semiconductor substrate portion is greater than a second height of the strain-inducing portion.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other features of the invention are apparent from the following detailed description taken in conjunction with non-limiting embodiments illustrated in the accompanying drawings. FIGS. 1-8B are a series of views illustrating a method of forming a vertical FET device according to exemplary embodiments of the present teachings, in which:

DETAILED DESCRIPTION

Various embodiments of the present disclosure are described herein with reference to the related drawings.

Alternative embodiments may be devised without departing from the scope of this disclosure. It is noted that various connections and positional relationships (e.g., over, below, adjacent, etc.) are set forth between elements in the following description and in the drawings. These connections and/or positional relationships, unless specified otherwise, may be direct or indirect, and the present disclosure is not intended to be limiting in this respect. Accordingly, a coupling of entities may refer to either a direct or an indirect coupling, and a positional relationship between entities may be a direct or indirect positional relationship. As an example of an indirect positional relationship, references in the present disclosure to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

For the sake of brevity, conventional techniques related to semiconductor device and IC fabrication may not be described in detail herein. Moreover, the various tasks and process steps described herein may be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that may be utilized in implementing one or more embodiments of the present disclosure will now be provided. Although specific fabrication operations used in implementing one or more embodiments of the present disclosure may be individually known, the disclosed combination of operations and/or resulting structures of the present disclosure are unique. Thus, the unique combination of operations described in connection with the fabrication of a coupler system according to the present disclosure utilize a variety of individually known physical and chemical processes performed on a semiconductor (e.g., silicon) substrate. In general, the various processes used to form a micro-chip that will be packaged into an IC fall into three categories, namely, film deposition, patterning, etching and semiconductor doping. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of one or more embodiments, finFETs exhibit favorable current-to-size switching capabilities for integrated circuits. FinFETs also exhibit favorable electrostatic properties corresponding to reduced footprints of high-density, low-power, integrated circuits. Because the fin and channel are raised from the substrate, finFETs can exhibit reduced cross-coupling between proximal devices.

In some cases, speed, junction leakage current, and/or breakdown voltage considerations may create a need for semiconductor material other than silicon (Si). For example, silicon germanium (SiGe) can provide higher hole (or electron) mobility, higher device speed, and lower junction leakage than bulk Si. As a result, some devices may be fabricated from SiGe that is epitaxially grown on a silicon substrate.

Hole (or) electron mobility can be further enhanced by straining the channel region. Straining of Si or SiGe can be used to improve some of its electrical properties. For example, compressive straining of Si can improve hole mobility through silicon, while tensile straining of Si can improve electron mobility. A strain-inducing layer comprising SiGe, for example, is typically formed below the Si channel layer of a fin. However, plastic relaxation of the SiGe strain layer occurs when the SiGe layer is too thick. This plastic relaxation phenomenon causes defects in the SiGe layer, which also propagate into the Si channel region. Consequently, the strain induced in the channel region of a conventional strained finFET device is typically limited to a maximum thickness of the SiGe to avoid plastic relaxation.

Various non-limiting embodiments of the invention provide a semiconductor device such as a finFET, for example, which includes an optimized elastic SiGe strain buffer. The elastic phenomena resulting from the SiGe strain buffer reduces or even eliminates plastic relaxation in the active semiconductor channel region. In at least one embodiment, the elastic phenomena of the SiGe strain buffer is optimized by interposing the SiGe strain buffer between a lower substrate layer and an upper active semiconductor layer, and etching the lower substrate layer to a depth that exceeds a vertical thickness of the SiGe strain buffer. In this manner, the elastic phenomena is enhanced such that the SiGe strain buffer applies maximum strain to the upper active semiconductor layer while allowing the overall thickness of the SiGe strain buffer to be reduced.

Figure 1:
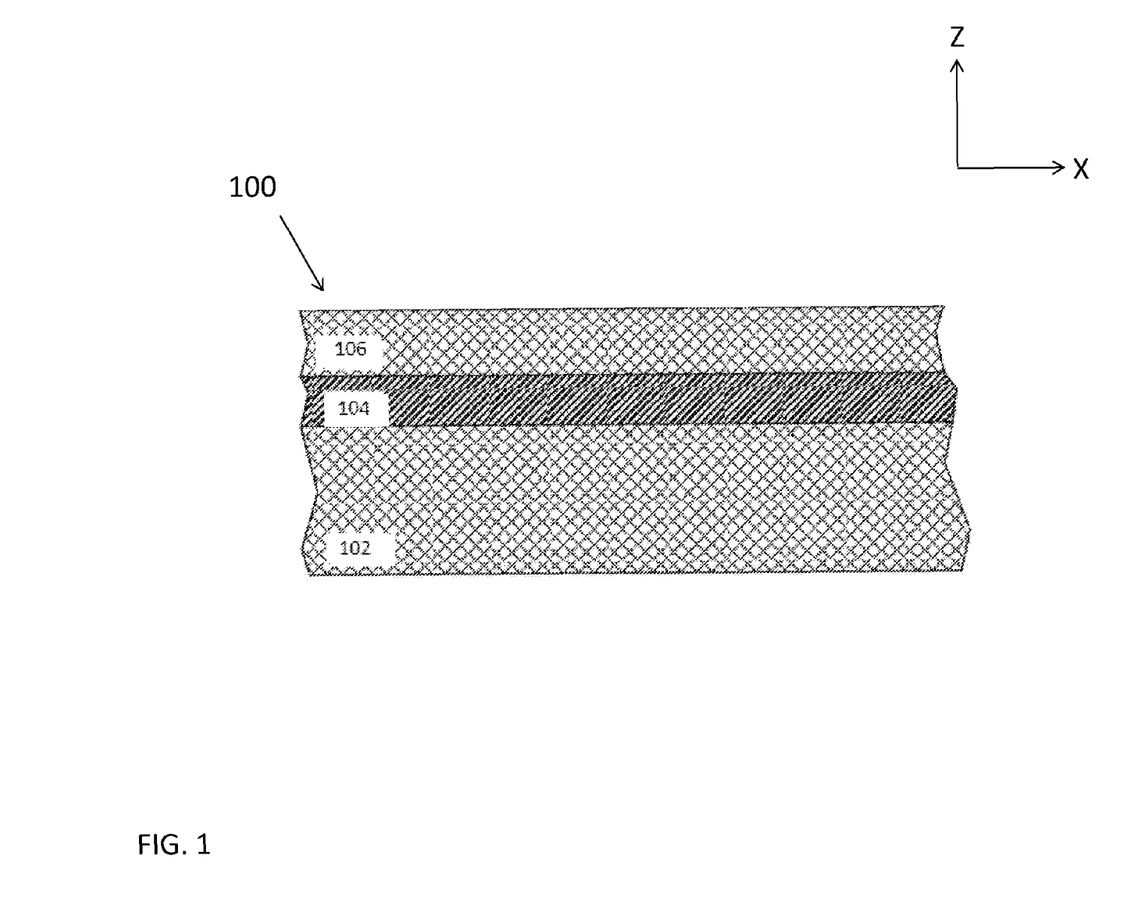
FIG. 1 is block diagram of staring substrate including a strain-inducing layer interposed between a substrate layer and an active semiconductor layer according to a non-limiting embodiment.

With reference now to FIG. 1, a starting stacked substrate 100 is illustrated according to a non-limiting embodiment. The stacked substrate 100 extends along a first direction (e.g., X-axis) to define a length and a second direction (Z-axis) to define a height. According to a non-limiting embodiment, the stacked substrate 100 includes a substrate layer 102, a strain-inducing layer 104 formed on an upper surface of the substrate layer 102, and an active semiconductor layer 106.

The substrate layer 102 comprises a semiconductor material including, but not limited to, Si, and may have a thickness ranging from 1 micron (μm) to 1000 μm. The strain-inducing layer 104 may be epitaxially grown on an upper surface of the substrate layer 102, and the active semiconductor layer 106 may be subsequently formed on the upper surface of the strain-inducing layer 104.

The active semiconductor layer 106 may comprise a semiconductor material such as, for example, Si. The strain-inducing layer 104 may also comprise a semiconductor material, but one having a lattice constant that is different from the lattice constant of the active semiconductor layer 106. For example, when the active semiconductor layer 106 comprises Si, the strain-inducing layer 104 may comprise SiGe or silicon carbide (SiC). The strain-inducing layer 104, because of a lattice mismatch with the substrate, will epitaxially grow in a strained state.

The strain-inducing layer 104 may be formed from SiGe in some embodiments (e.g., to induce tensile stress in a resulting semiconductor fin to improve electron mobility through the channel region) or SiC in other embodiments (e.g., to induce compressive stress in a resulting semiconductor fin to improve electron mobility through the channel region). As may be appreciated, other materials exhibiting a lattice mismatch with the substrate and device layer may be used instead of SiGe or SiC, and different material systems may be used in other implementations.

When patterning the active semiconductor layer 106 fin and underlying straining material to form one or more semiconductor fins as discussed below, the strain-inducing layer can locally and elastically relax to relieve its strain. This elastic relaxation can impart strain to the etched fin. Additionally, because the formation of the strain-inducing layer and relaxation of that layer can be purely elastic, there may be no appreciable defects generated in the strain-inducing layer and/or the device layer, as would be generated from thicker, plastic SiGe layers that may suffer from plastic deformation and relaxation, for example. Further details regarding device fabrication and the formation of the semiconductor fins are described below.

In at least one embodiment, the initial lattice constant of the substrate layer 102 is about 5.431 Å (Silicon), the initial lattice constant of the strain-inducing layer 104 is about 5.48 Å (SiGe25%) and the initial lattice constant of the active semiconductor layer 106 is about 5.431 Å (Silicon), The thickness of the strain-inducing layer 104 may range, for example, from about 5 nm and to about 250 nm. The thickness of the active semiconductor layer 106 may range, for example, from about 5 nm and to about 100 nm.

Figure 2:
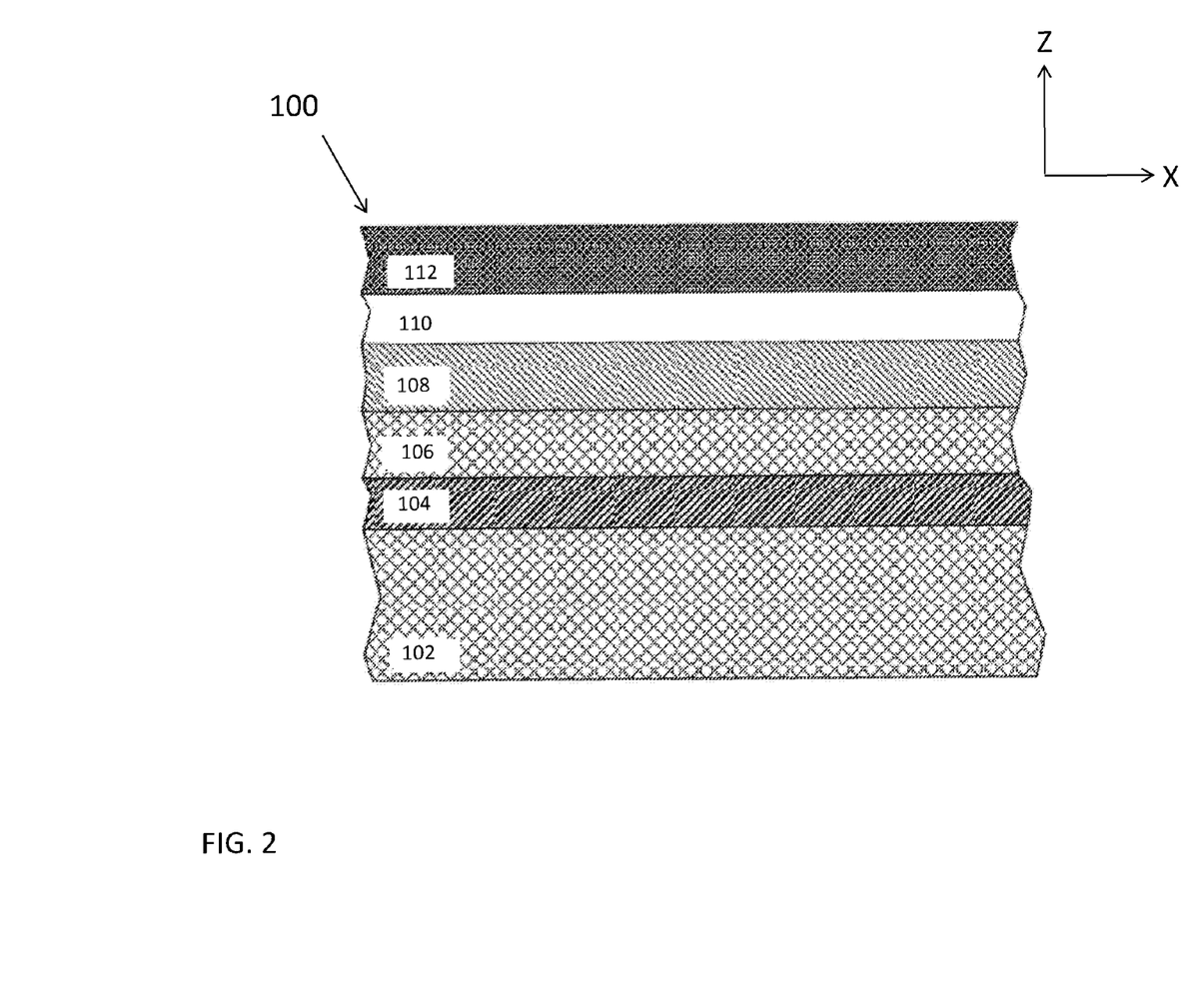
FIG. 2 illustrates the substrate illustrated in FIG. 1 following a stacked arrangement of fin patterning layers atop the active semiconductor layer.

Turning now to FIG. 2, the substrate 100 is illustrated following a stacked arrangement of fin patterning layers atop the active semiconductor layer 106. For example, a hard mask layer 108 may be deposited over the active semiconductor layer 106. The hard mask layer may comprise silicon nitride (e.g., $Si_3N_4$) in some embodiments, though any suitable hard mask material may be used that exhibits etch selectivity over the underlying semiconductor materials. The thickness of the hard mask material may be between 10 nm and 100 nm in some embodiments, between 20 nm and 50 nm in some embodiments, and in some embodiments may be about 40 nm.

An insulating layer 110 may be formed on the hard mask layer 108. In at least one embodiment, the insulating layer 110 may comprise undoped silicate glass (USG), and its thickness may be between 10 nm and 100 nm in some embodiments, between 20 nm and 50 nm in some embodiments, and in some embodiments may be about 30 nm. The insulating layer 110 may be applied by any suitable means, e.g., via physical deposition, a plasma deposition process, or a spin-on and anneal process.

A patterning layer 112 may be deposited over the insulating layer 110. In some embodiments, the patterning layer 112 may comprise amorphous silicon that is deposited by a plasma deposition process, though any suitable material may be used. The patterning layer 112 may be between 10 nm and 100 nm in some embodiments, between 20 nm and 50 nm in some embodiments, and in some embodiments may be about 40 nm.

Figure 3:
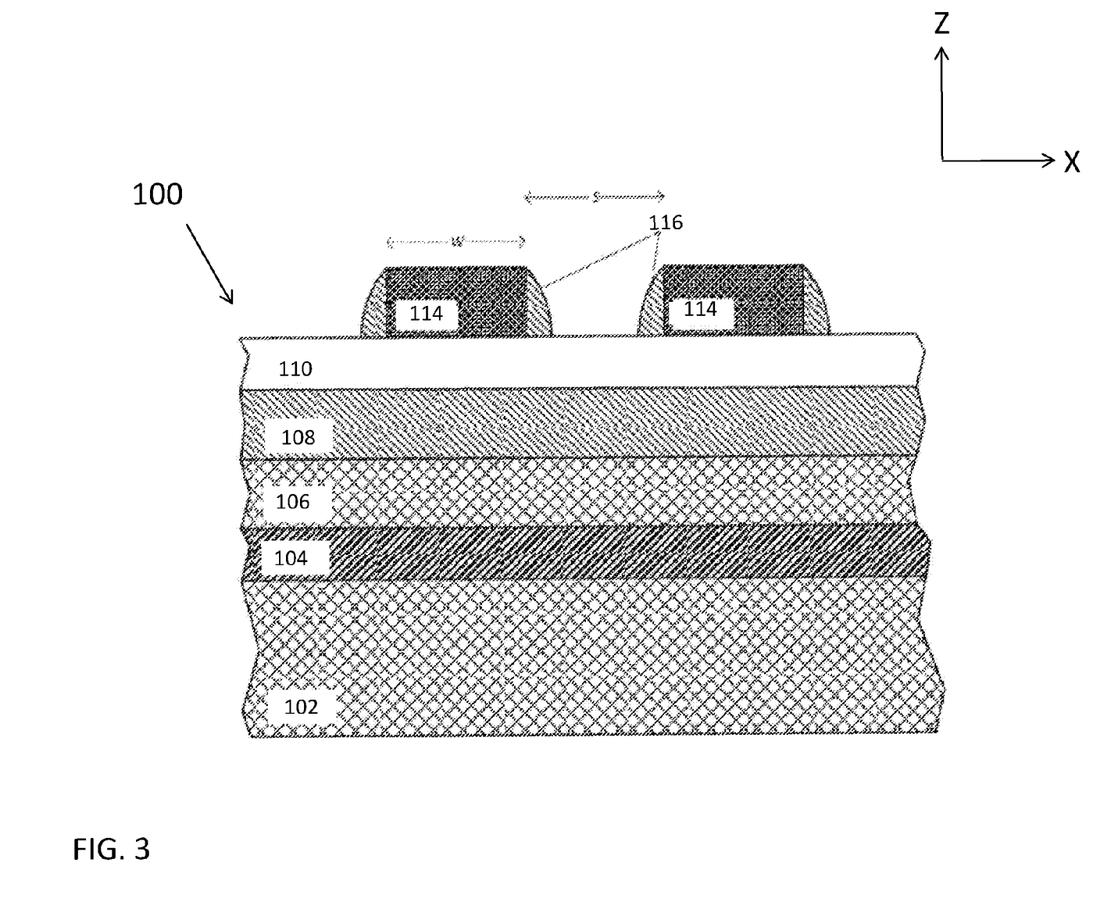
FIG. 3 illustrates the substrate illustrated in FIG. 2 after patterning fin patterning layers to form mandrels and spacers on the sidewalls of the mandrels.

Referring to FIG. 3, mandrels 114 may be patterned in the patterning layer 112 using any suitable method, e.g., photolithography and etching. The photolithography may require forming a photoresist layer over the patterning layer 112, exposing and developing the photoresist, and etching the patterning layer. In some embodiments, the mandrels 114 may be patterned using a mandrel lithography process. In some implementations, the mandrels 114 may be patterned using interferometric lithography techniques. The mandrels 114 may be patterned to achieve a desired length for a fin of a finFET transistor. The width and spacing of the mandrels 114 may be chosen to provide desired spacings between multiple fins of a finFET device or between multiple finFET devices.

A blanket masking layer (not shown) may be deposited over the mandrels 114 and insulating layer 110. In some embodiments, the blanket masking layer may comprise silicon nitride that is deposited by a plasma deposition process. The thickness of the masking layer may range, for example, from about 5 nm to about 100. The blanket masking layer may be patterned to form spacer structures 116, as further illustrated in FIG. 3.

Figure 4:
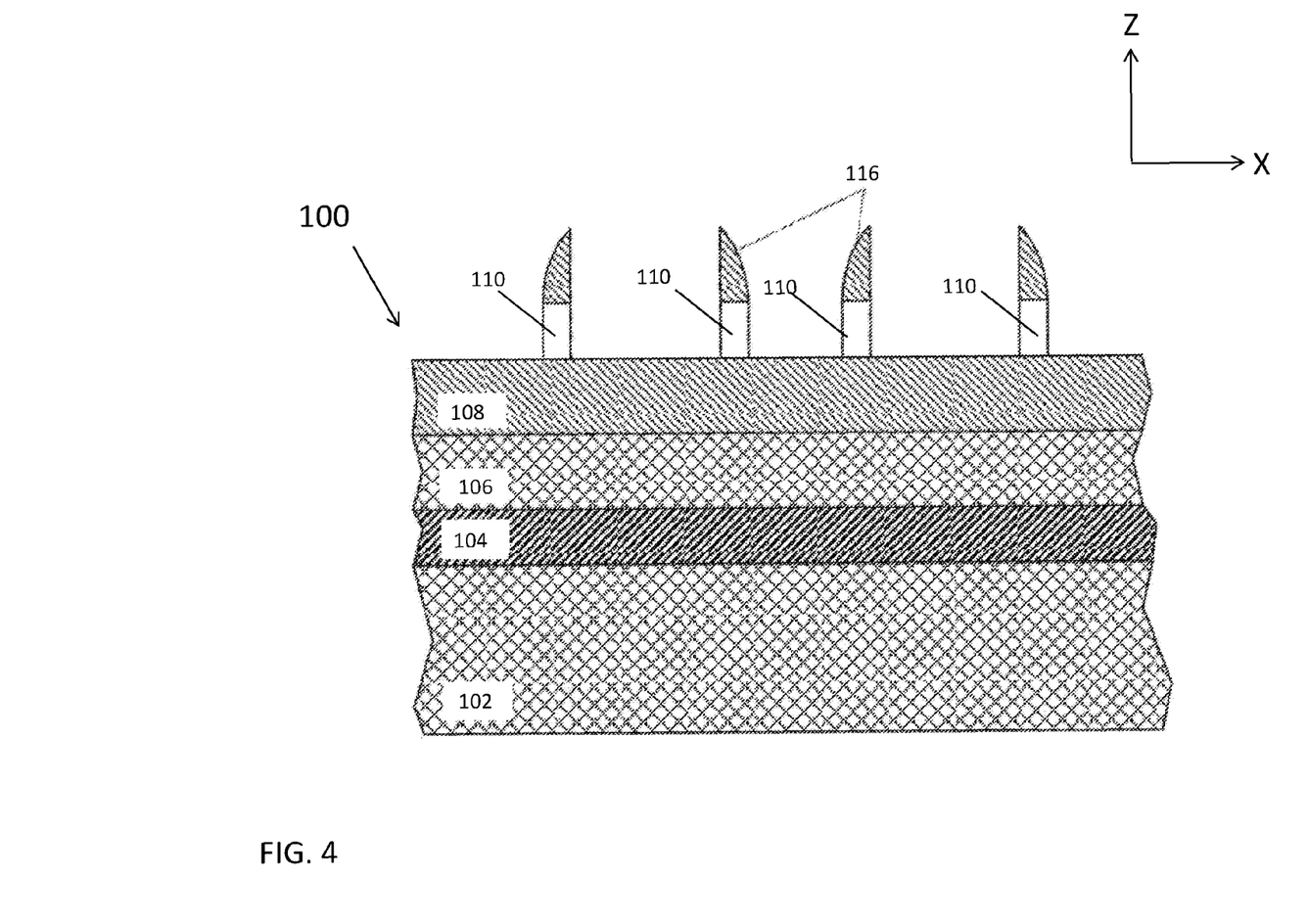
FIG. 4 illustrates the substrate illustrated in FIG. 3 after removing the mandrels from between the spacers to define a fin pattern.

Referring to FIG. 4, a series of etching steps may then be used to pattern fins in the active semiconductor layer 106, where the spacer structures 116 define the pattern of the fins. For example, a first selective, anisotropic etch may be performed to remove the mandrels 114. The same etch chemistry, or a different etch chemistry may be used to remove most of the insulating layer 110, thereby transferring the pattern of the spacer structures 116 to the insulating layer 110.

A second selective, anisotropic etch may be performed to remove portions of the hard mask layer 108, thereby transferring the pattern from the insulating layer 110 to the hard mask layer 108. According to a non-limiting embodiment, a suitable oxide-based, dry plasma ashing process highly selective to mandrels 114 is used such that the sidewall spacers 116 are only negligibly eroded. In one embodiment, ashing of mandrels 114 is performed with a selectivity of about 50 or greater relative to sidewall spacers 116. That is, during the ashing process, the consumption or etch rate of mandrels 114 is at least about 50 times that of spacers 116. If the hard mask layer 108 and spacer structures 116 are formed of the same material, most or all of the spacer structures 116 may be removed during the etch, and the patterned insulator layer 110 serves as an etch mask for the hard mask layer 108. Additional selective, anisotropic etches may be performed to transfer the pattern from the hard mask layer 108 into the underlying the active semiconductor layer 106 and strain-inducing layer 104. Accordingly, one or more fin structures 118 are formed as illustrated in FIGS. 5A-5B.

Figure 5A:
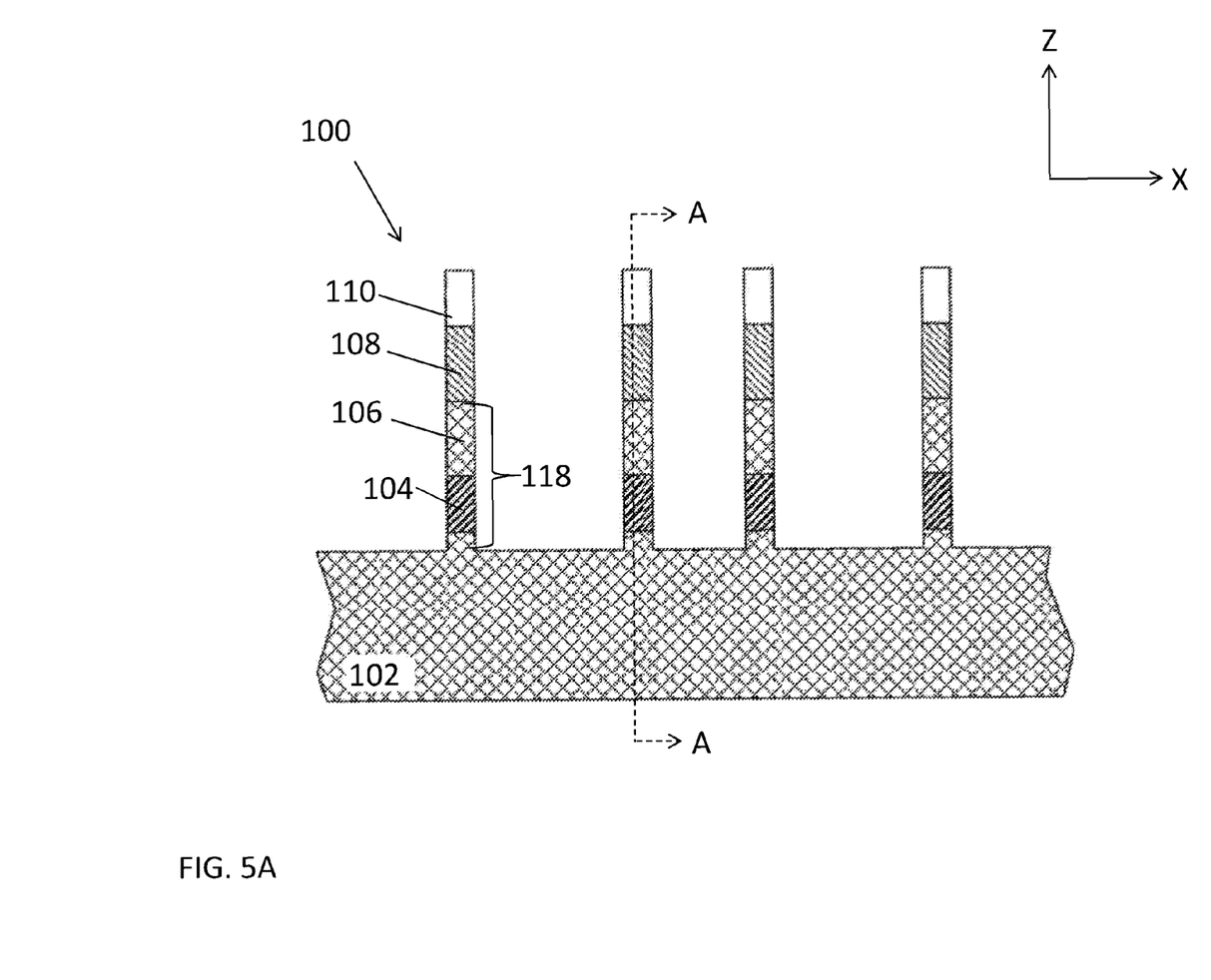
FIG. 5A illustrates the substrate illustrated in FIG. 4 according to a first orientation after transferring the fin pattern into the substrate and stopping on an upper surface of the substrate layer to form a plurality of semiconductor fin structures.
Figure 5B:
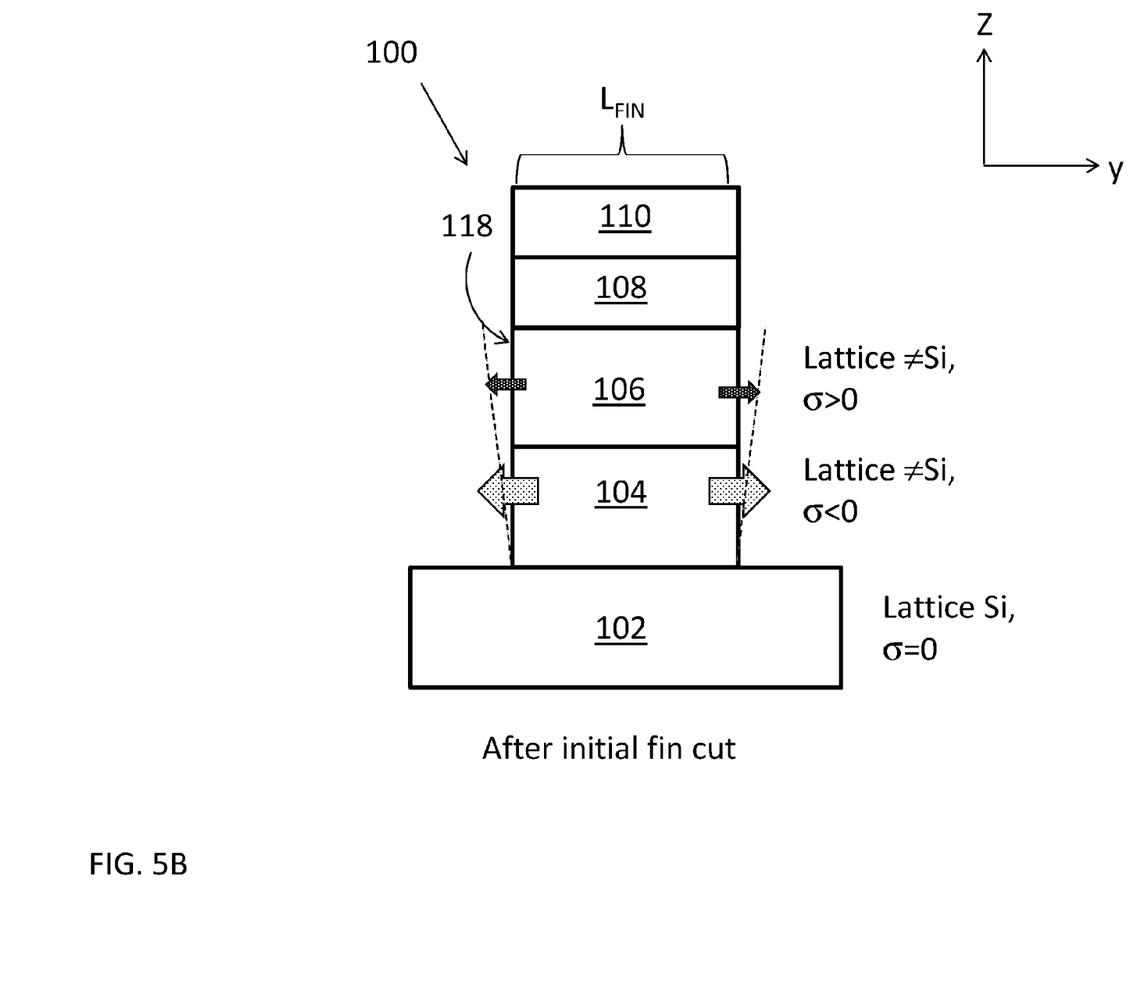
FIG. 5B is a second orientation of the substrate shown in FIG. 5A taken along line A-A to illustrate a strained semiconductor fin following the fin transfer process.

Still referring to FIGS. 5A-5B, the structure 100 is etched to expose the upper surface of the substrate layer 102. The remainder of spacers 116 may then be removed using any suitable wet or preferably dry etch process selective to spacers 116 to avoid erosion of fin structures 118. Accordingly, the fin structure 118 are formed such that the strain-inducing layer 104 is formed on an upper surface of the substrate layer 102 as further illustrated in FIG. 5B. The fin structure 118 may have horizontal length (e.g., $L_{FIN}$ along the Y-axis) ranging, for example, from approximately 30 nm to approximately 10 µm.

The combination of etching the fin structures 118 (i.e., semiconductor fins 118) through the strain-inducing layer 104 and removing the hard mask layer 108 allows the strain-inducing material to relax locally at each fin structure 118 and relieve some of its strain. In doing so, the strain-inducing layer 104 imparts a first strain (e.g. compressive) while the active semiconductor layer 106 (which defines a channel region of the fin structure 118) imparts a second strain (e.g., a tensile strain). Because of the narrow and long fin structures 118, the resulting strain in the fin structures 118 will be substantially uniaxial, longitudinal strain along the length of the fin 118. According to some embodiments, relaxation of the strain-inducing layer 104 may be purely elastic, such that no appreciable defects are generated.

Figure 6:
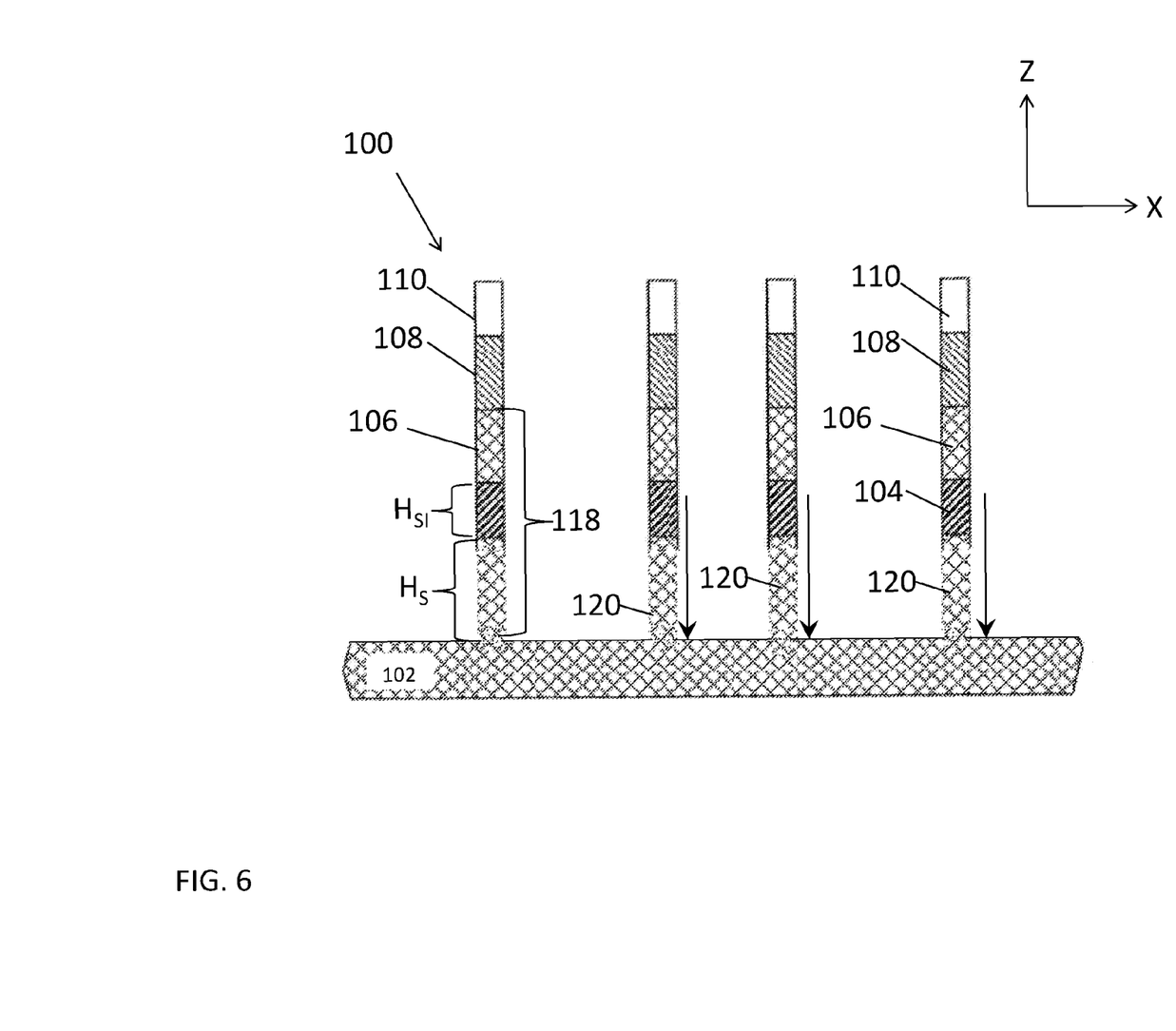
FIG. 6 illustrates the substrate of FIGS. 5A-5B according to the first orientation following an etching process to extend the depth of the fin structures into the substrate layer to form strained fin structures having a substrate portion interposed between the strain-inducing layer and the remaining substrate layer.

Turning now to FIG. 6, the pattern of the fin structures 118 is extended into the substrate layer 102 and below the strain-inducing layer 104 as indicated by the downward directional arrows. Accordingly, the vertical length (e.g., height) of the fin 118 is extended to include an etched substrate portion 120 that extends from a lower end of the strain-inducing layer 104 to the upper surface of the remaining substrate layer 102. In at least one embodiment, the vertical length ($H_S$) of the etched substrate portion 120 is greater than the vertical length ($H_{SI}$) of the strain-inducing layer 104. In at least one embodiment, $H_S$ may range from 2 times $H_{SI}$ to 10 times $H_{SI}$. In another embodiment, the $H_S$ of the etched substrate portion 120 $H_S$ is smaller than $H_{SI}$ of the strain-inducing layer 104. For example, $H_S$ may range from approximately 50 nm to approximately 150 nm, while $H_{SI}$ may range from approximately 100 nm to approximately 300 nm. By etching deeper into the substrate layer 102, which increases $H_{SI}$, however, the strain-inducing layer 104 may be further relaxed. Accordingly, the strain (e.g., compressive strain) applied by the strain-inducing layer 104 is further increased, which in turn enhances strain, i.e., increases the strain, (e.g., tensile strain) applied by the active semiconductor layer 106. That is, at least one embodiment further relaxes the strain inducing layer 104 such that the amount of elastic relaxation increases with the amount of recess into the substrate layer 102.

Figure 7:
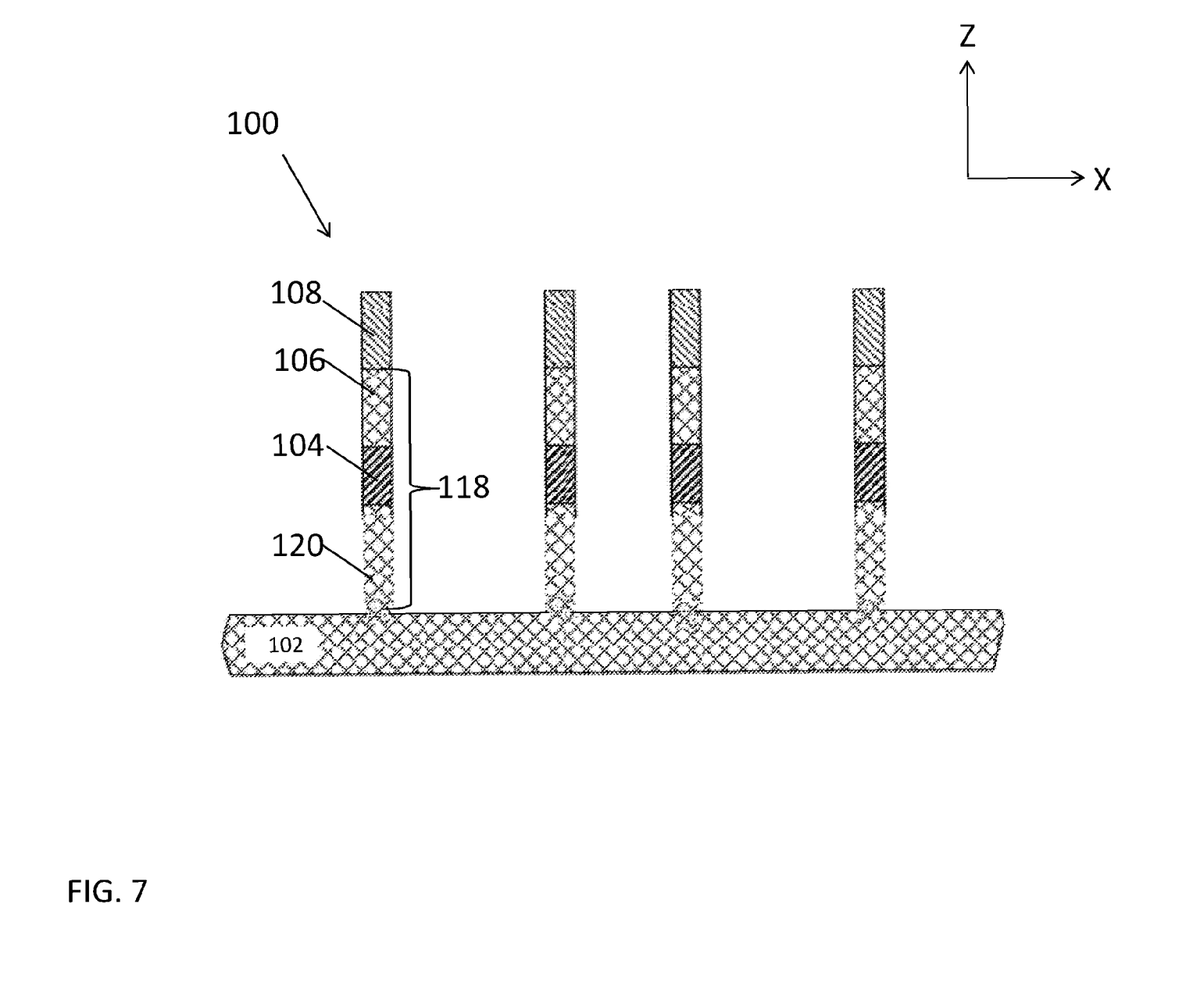
FIG. 7 illustrates the substrate of FIG. 6 following removal of the remaining insulator layer.
Figure 8A:
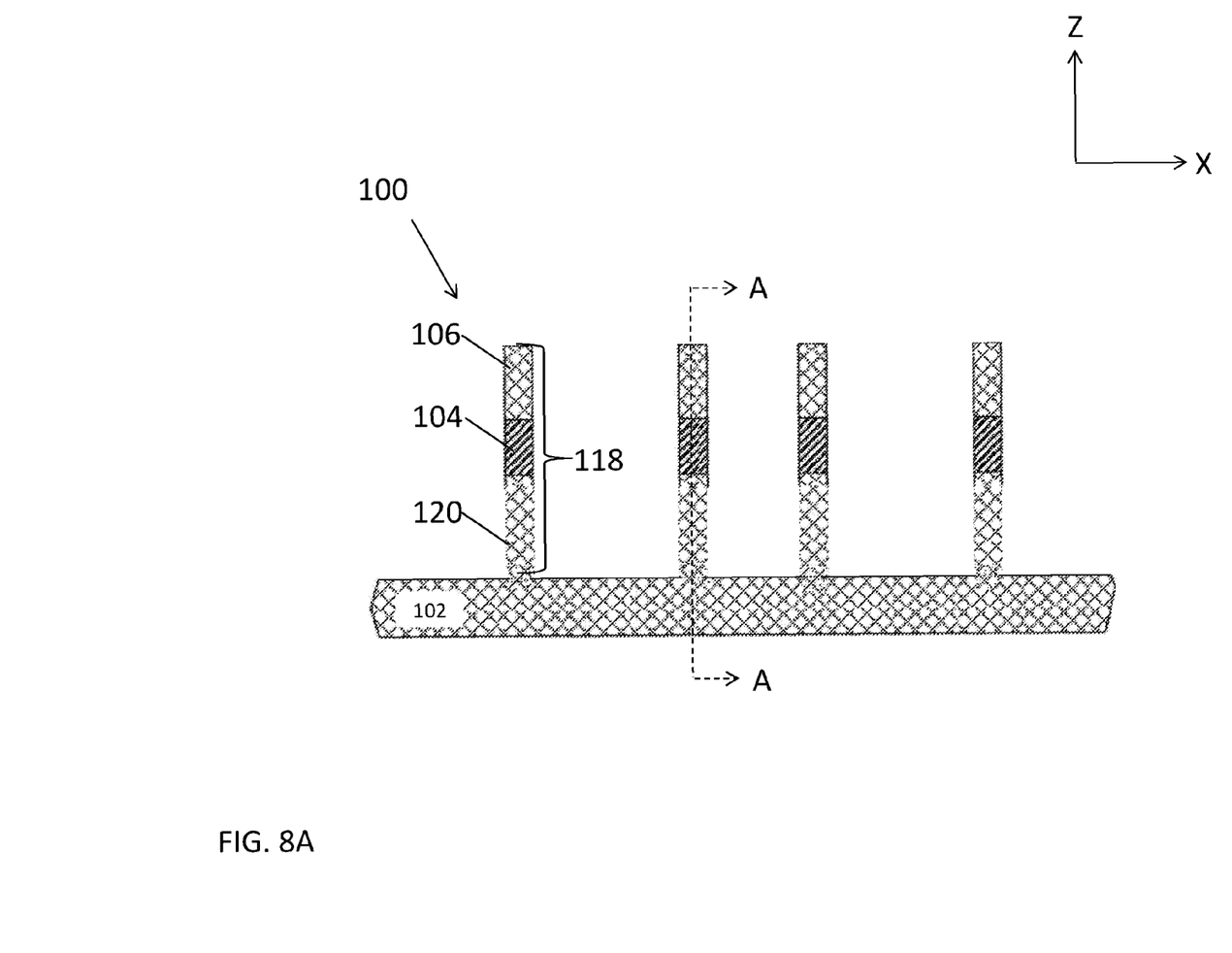
FIG. 8A illustrates the substrate having an extended fin etching depth to form strained fin structures including a substrate portion formed on an upper surface of the remaining substrate layer.

Turning to FIG. 7, the upper insulating material 110 may be removed from the substrate (e.g., using a wet or dry etch) leaving exposed hard mask layer 108. In a similar manner, the hard mask layers 108 may then be removed using, for example, a wet or dry etch. Accordingly, the semiconductor structure 100 including one or more strained fin structures 118 formed atop the substrate layer 102 is formed as illustrated in FIGS. 8A-8B.

Figure 8B:
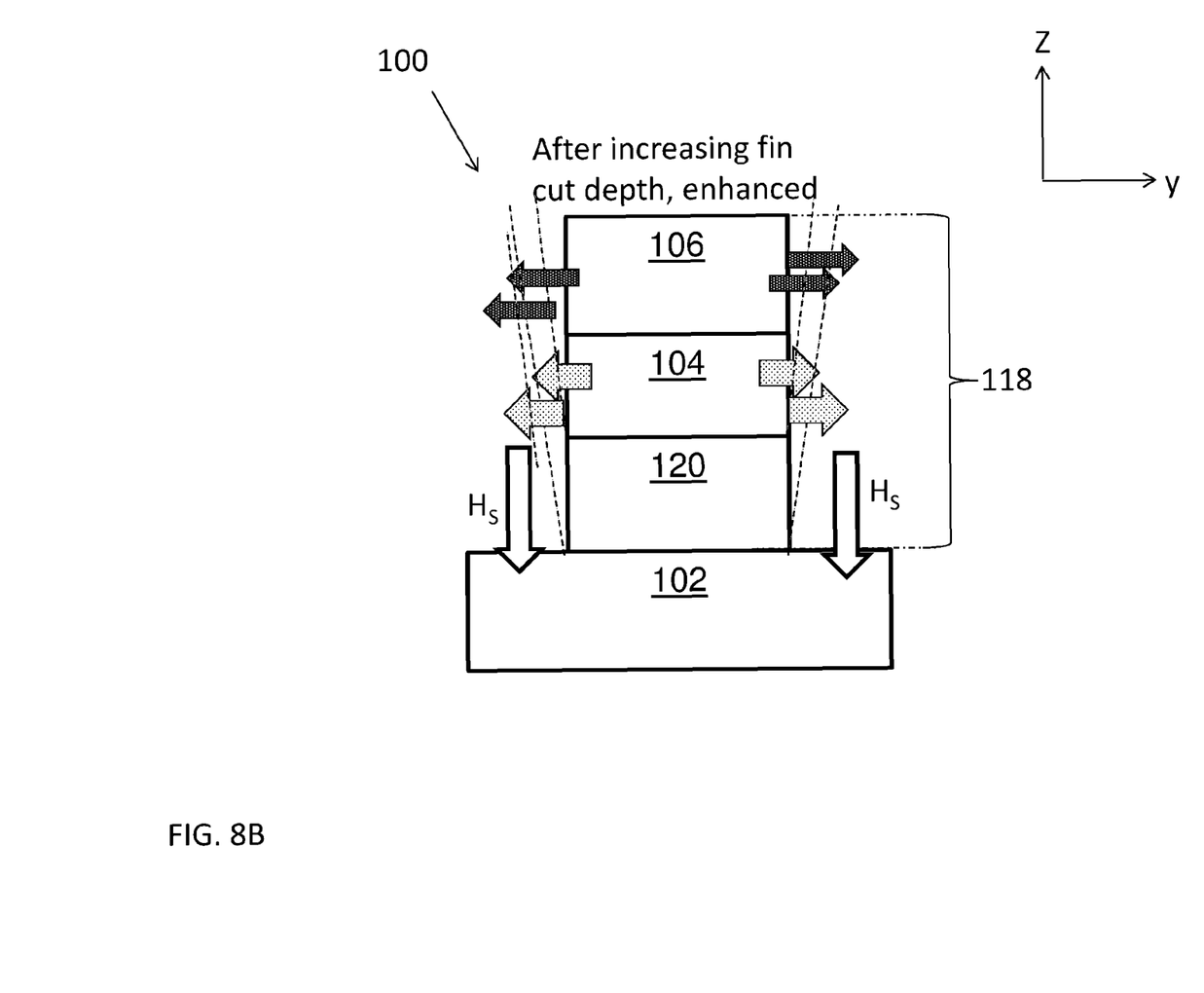
FIG. 8B illustrates an enhanced strained fin structure in the second orientation after extending the fin etch deep into the substrate layer and below the strain-inducing layer.

As further illustrated in FIG. 8B, the elastic deformation applied to the strained fin structure 118 is enhanced (as indicated by the double horizontal layer) due to the increased depth of the fin etch into the substrate layer 102. Under conventional wisdom, it was previously understood that the strain applied to finFET channel layer could be increased only by increasing the thickness (i.e., vertical height of the strain-inducing layer). However, several numerical simulations based on finite element analysis were carried out that support results of enhanced elastic deformation according to various embodiments of the invention. These results show that enhanced elastic deformation can be achieved in response to increasing the etching depth below the strain-inducing layer 104 independently from the thickness (i.e., vertical length) of the strain-inducing layer 104 according to at least one embodiment of the invention described above. As described above, the $H_S$ may range from 2 times $H_{SI}$ to 10 times $H_{SI}$. Therefore, at least one unexpected result is realized when the etching depth (i.e., $H_S$) is greater than the vertical length ($H_{SL}$) of the strain-inducing layer 104 in that the strain applied to the channel region (i.e., active semiconductor region 106) of the fin structure 118 is maximized without needing to increase the thickness of the strain-inducing layer 104. Accordingly, a thinner strain-inducing layer 104 may be incorporated that also increases the strain on the channel region (e.g., greater than 1 GPa of strain) compared to lower strain levels achieved in conventional finFET devices, but without the concerns of causing plastic relaxation which limits conventional strained finFET fabrication techniques.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of straining a channel region of a fin-type field effect transistor (finFET), the method comprising:
    forming a first semiconductor layer (104) in a strained state on an upper surface of a semiconductor substrate;
    forming a second semiconductor layer (106) on an upper surface of the first semiconductor layer (104),
    patterning the second semiconductor layer (106) to form a semiconductor fin on an upper surface of the first semiconductor layer (104), the semiconductor fin defining a strained channel region (106) of the finFET; and
    etching the first semiconductor layer (104) to extend a depth of the semiconductor fin into the semiconductor substrate (102) and below the strain channel region (106) so as to relieve a strain in the first semiconductor layer (104) and enhance strain in the strained channel region,
    wherein extending the depth includes etching the semiconductor substrate (102) such that a distance extending along the vertical axis between the strained channel region (106) and an upper surface of the semiconductor substrate (102) exceeds a thickness of the strained channel region (106) extending along the vertical axis to further increase the strain in the strained channel region (106).

2. The method of claim 1, wherein forming the first semiconductor layer includes epitaxially growing the first semiconductor layer with a first lattice constant that is mismatched with respect to a second lattice constant of the semiconductor substrate.

3. The method of claim 2, wherein forming the second semiconductor substrate includes epitaxially growing the second semiconductor layer with a third lattice constant that is mismatched with respect to the first lattice constant of the first semiconductor layer.

4. The method of claim 3, wherein a first strain of the first semiconductor layer is a compressive strain and a second strain of the strained channel region is a tensile strain.

5. The method of claim 3, wherein a first strain of the first semiconductor layer is a tensile strain and a second strain of the strained channel region is a compressive strain.

6. A method of straining in a channel region of a fin-type field effect transistor (finFET), the method comprising:
   forming a strain-inducing layer (104) on an upper surface of a semiconductor substrate (102), the strain-inducing layer having a first lattice constant that is mismatched with respect to a second lattice constant of the semiconductor substrate;
   forming an active semiconductor layer (106) on an upper surface of the strain-inducing layer, the active semiconductor layer having a third lattice constant that is mismatched with respect the first lattice constant;
   patterning the active semiconductor layer (106) to form at least, one semiconductor fin that defines a channel region of the finFET;
   etching the strain-inducing layer (106) to increase a depth of the at least one fin and relieve a first strain applied to the strain-inducing layer (104) while inducing a second strain applied to the at least one semiconductor fin; and
   extending the depth of the at least one semiconductor fin into the semiconductor substrate (102) and below the strain-inducing layer (106) so as to increase the second strain applied to the channel region defined by the semiconductor fin
   wherein extending the depth includes etching the semiconductor substrate (102) such that a distance extending along the vertical axis between the strain-inducing layer (106) and an upper surface of the semiconductor substrate (102) equals, or is greater than, a thickness of the strain-inducing layer (106) extending along the vertical axis.

7. The method of claim 6, wherein the mismatch between the first lattice constant and the second lattice constant induces a compressive strain in the strain-inducing layer, and the mismatch between the first lattice constant and the third lattice constant induces a tensile strain in the channel region.

8. The method of claim 6, wherein the mismatch between the first lattice constant and the second lattice constant induces a tensile strain in the strain-inducing layer, and the mismatch between the first lattice constant and the third lattice constant induces a compressive strain in the channel region.

9. The method of claim 7, wherein the semiconductor substrate comprises silicon (Si), the strain-inducing layer comprises silicon germanium (SiGe), and the active semiconductor layer comprises Si.

10. The method of claim 8, wherein the semiconductor substrate comprises silicon (Si), the strain-inducing layer comprises silicon carbide (SiC), and the active semiconductor layer comprises Si.

11. A fin-type field effect transistor (finFET) including a strained channel region, the finFET comprising:
   a semiconductor substrate extending along a first axis to define a length, a second axis perpendicular to the first axis to width, and a third axis perpendicular to the first and second axes to define a height;
   at least one semiconductor fin on an upper surface of the semiconductor substrate, the at least one semiconductor fin comprising:
      a semiconductor substrate portion on an upper surface of the semiconductor substrate;
      a strain-inducing portion on an upper surface of the semiconductor substrate portion; and
      an active semiconductor portion defining a strained channel region on an upper surface of the strain-inducing portion,
      wherein a first height of the semiconductor substrate portion extending along the third axis is equal, or is greater than, a second height of the strain-inducing portion extending along the third axis.

12. The finFET of claim 11, wherein a total width of the strain-inducing layer portion substantially matches a total width of the semiconductor substrate portion, and wherein the first height is at least twice the second height.

13. The finFET of claim 11, wherein the strain-inducing portion has a first lattice constant that is mismatched with respect to a second lattice constant of the semiconductor substrate portion, and the active semiconductor portion has a third lattice constant that is mismatched with respect the first lattice constant.

14. The finFET of claim 13, wherein the strain-inducing portion has a compressive strain based on the mismatch between the first lattice constant and the second lattice constant, and the active semiconductor portion has a tensile strain based on the mismatch between the first lattice constant and the third lattice constant.

15. The finFET of claim 13, wherein the strain-inducing portion has a tensile strain based on the mismatch between the first lattice constant and the second lattice constant, and the active semiconductor portion has a compressive strain based on the mismatch between the first lattice constant and the third lattice constant.

16. The finFET of claim 14, wherein the semiconductor substrate portion comprises silicon (Si), the strain-inducing portion comprises silicon germanium (SiGe), and the active semiconductor portion comprises Si.

* * * * *